United States Patent [19]

Sakakibara et al.

[11] Patent Number: 5,047,797
[45] Date of Patent: Sep. 10, 1991

[54] IMAGE RECORDING APPARATUS CAPABLE OF ADJUSTING A DENSITY OF AN IMAGE REPRODUCED ON A RECORDING MEDIUM

[75] Inventors: Kenji Sakakibara, Ichinomiya; Michitoshi Akao, Nagoya; Yukichi Sawaki, Gifu; Tokunori Katoh, Ichinomiya, all of Japan

[73] Assignee: Brother Kogyo Kabushiki Kaisha, Japan

[21] Appl. No.: 328,318

[22] Filed: Mar. 24, 1989

[30] Foreign Application Priority Data

Mar. 25, 1988 [JP] Japan .................................. 63-72864

[51] Int. Cl.$^5$ ............................................. G03B 27/32
[52] U.S. Cl. ..................................................... 355/27
[58] Field of Search ....................... 355/27, 28, 32, 50, 355/51, 68, 69, 55, 233; 430/138

[56] References Cited

U.S. PATENT DOCUMENTS

| 4,426,149 | 1/1984 | Kuemmel et al. | 355/55 |
| 4,614,520 | 10/1986 | Araya | 355/69 |
| 4,767,673 | 9/1988 | Tomosada et al. | 355/233 |
| 4,809,049 | 2/1989 | Okuzawa et al. | 355/28 |

Primary Examiner—L. T. Hix
Assistant Examiner—Khanh Dang
Attorney, Agent, or Firm—Oliff & Berridge

[57] ABSTRACT

An image recording apparatus for recording an image of an original on a photosensitive recording medium. Light emitted from a light source is irradiated onto the original to optically scan the original, and light reflected from or transmitted through the original is applied to the recording medium to thereby record the image on the recording medium. The density of an image to be recorded on the photosensitive recording medium is adjusted by changing the scanning speed while maintaining an amount of light emitted from a light source at constant, whereby a load imposed to the light source is reduced which may otherwise be increased if an amount of light emitted therefrom is changed to adjust the image density.

18 Claims, 2 Drawing Sheets

IMAGE RECORDING APPARATUS CAPABLE OF ADJUSTING A DENSITY OF AN IMAGE REPRODUCED ON A RECORDING MEDIUM

BACKGROUND OF THE INVENTION

The present invention relates generally to an image recording apparatus, such as a copying machine, and more particularly to an image recording apparatus in which a density of a reproduced image can be adjusted.

Various types of image recording apparatuses have been known and used in the art. One typical apparatus includes a light source for emitting a light toward the image face of an original. A photosensitive recording medium is disposed in a position where the light reflected upon or transmitted through the original is irradiated thereonto, so that the image of the original is recorded on the recording medium. More specifically, the light source and an original support pane on which the original is placed are moved relative to each other, and the light reflected from or transmitted through the original is irradiated through an optical system onto the photosensitive recording medium. A latent image is therefore formed on the recording medium, which is then developed and transferred to an image receiving sheet so that a visible image is provided thereon.

In such a recording apparatus, it has been required that the density of the image formed on the image receiving sheet be adjusted as desired, and this can be accomplished by manipulating a density adjusting switch provided on a panel. The output of the switch is applied to a light amount control unit for controlling an amount of light emitted from the light source, so that the amount of light emitted therefrom is controlled in response to the signal outputted from the density adjusting switch. In this manner, the amount of light reflected from or transmitted through the original has been controlled so that an amount of light applied to the recording media is changed to change the density of the visible image.

However, when recording mediums low in sensitivity to light are used, such as a photosensitive pressure-sensitive recording medium as disclosed in U.S. Pat. No. 4,399,209 to Sanders et al, the amount of light emitted from the light source needs to be increased even if the recording is performed under a normal density mode. If it is required that the recording be performed under a high density mode, the amount of light emitted from the light source must further be increased. This shortens the service life of the light source and incurs serious problems, i.e. an increased amount of heat generation and an increased amount of current consumption.

SUMMARY OF THE INVENTION

Accordingly, the present invention has been made to eliminate the aforementioned problems, and it is an object of the invention to provide an image recording apparatus in which a load imposed to a light source is decreased to thereby prolong the service life of the light source and ease the measures to counter the heat generation.

In order to achieve the above and other objects, the movement of the light source for scanning an original is varied to adjust the image density on an imaging sheet while maintaining the amount of light emitted from the light source at constant. In accordance with the present invention, there is provided an image recording apparatus for recording an image of an original on a photosensitive recording medium, a density of the image recorded on the recording medium being changed depending upon an amount of light applied to the recording medium, the apparatus comprising:

an original support member for supporting the original;

a light source for emitting a light toward the original supported on the original support member;

a first drive signal generating means for generating a first drive signal;

a first driving means responsive to the first drive signal for driving at least one of the original support member and the light source to move relative to each other at a first speed corresponding to the first drive signal, the image of the original being scanned at the first speed by the light emitted from the light source, an image bearing light bearing the image of the original being provided as a result of the scanning;

an optical means for receiving and applying the image bearing light onto the recording medium to record the image of the original thereon;

a density setting means for setting a density of the image to be reproduced on the recording medium and providing an image density instruction signal;

a control means for controlling the first drive signal generating means in accordance with the image density instruction signal, whereby the density of the image to be recorded on the recording medium is controlled by the change of the scanning speed.

The apparatus further comprises a second drive signal generating means for generating a second drive signal and a second driving means responsive to the second drive signal for moving the recording medium, and wherein the control means further controlling the second drive signal in accordance with the density instruction signal.

In operation, when the image density instruction signal is applied to the control means, the control means controls the first drive signal in accordance therewith. In response to the first drive signal received from the control means, either the orignal support member of the light source, or both are moved relative to each other at a speed determined by the image density as instructed by the density setting means so that an amount of light that the recording medium receives from the light source is controlled, thereby controlling the image density of the image to be reproduced on the recording medium.

DETAILED DESCRIPTION OF THE PREFERRED EMBODIMENTS

A preferred embodiment of the present invention will now be described with reference to the accompanying drawings.

Figure 1:
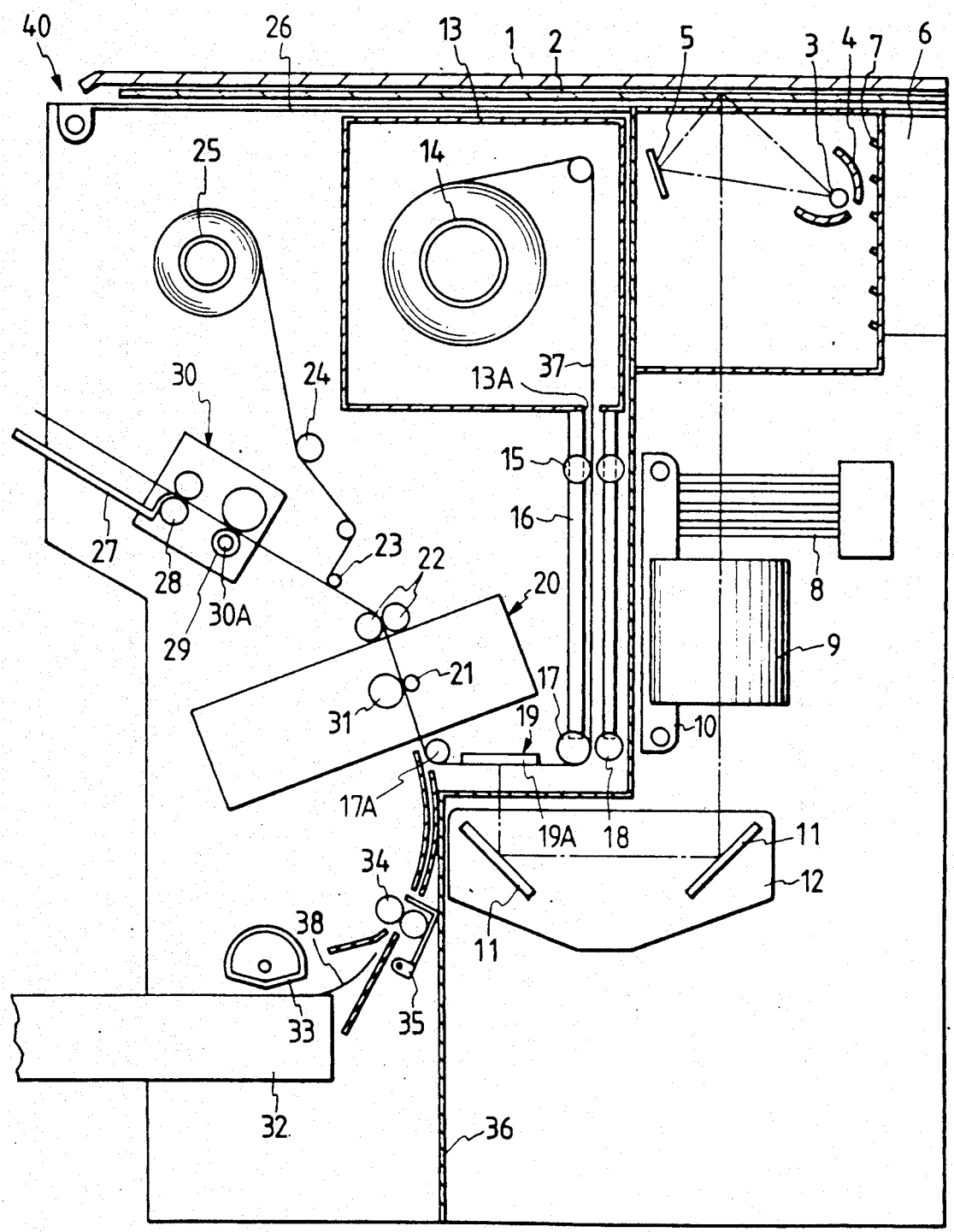
FIG. 1 is a vertical cross-sectional view showing an image recording apparatus according to one embodiment of the present invention.

FIG. 1 shows an image recording apparatus capable of performing full-color recording or copying. In this apparatus, a transfer type image recording medium as disclosed in U.S. Pat. No. 4,399,209 to Sanders et al is used. Briefly, this recording medium (hereinafter referred to as "microcapsule sheet") is coated with an immense number of microcapsules on one surface thereof. The microcapsules separately encapsulate a photo-curing (or photo-softening) resin and a chromogenic material of one of three primary colors, i.e. cyan, magenta and yellow. There is a separate image receiving sheet (hereinafter referred to as "developer sheet") having a surface coated with a developer material. When the microcapsule sheet is selectively exposed to light, the mechanical strength of the microcapsules in the exposed area is changed from soft to hard or vice versa to thereby form a latent image thereon corresponding to the pattern of the exposure. The latent image on the microcapsule sheet is developed under pressure to provide a visible image on the developer sheet by rupturing the microcapsules of weaker mechanical strength and having the chromogenic material released therefrom react with the developer material.

Referring to FIG. 1, a light shielding partition plate 36 is disposed in the apparatus 40 to spacedly divide the apparatus into two chambers. That is, a light source unit and an optical system are disposed within one chamber whereas other requisite units, such as a pressure developing and thermal fixing units, are disposed within the other chamber.

An elongated web-like microcapsule sheet 37 wound around a cartridge shaft 14 is retained in a microcapsule sheet cartridge 13 that is detachably disposed at a position immediately below an original support pane 2 and is formed with a bottom opening 13A. An exposure unit 19 is disposed below the sheet cartridge 13 at a downstream side thereof. The sheet 37 passes through a number of rollers and a pressure developing unit 20, and a leading end of the sheet 37 is attached to a take-up shaft 25 positioned beside the sheet cartridge 13. Between the sheet cartridge 13 and the exposure unit 19, feed roller 15 and a barrel roller 17 are rotatably provided at a vertical sheet path for guide travel of the sheet toward the exposure unit 19. At the downstream of the exposure unit 19, there is provided the pressure developing unit 20 which includes a small-diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed the uppermost developer sheet 38 toward the pressure developing unit 20. Between the cassette 32 and the pressure developing unit 20, a roller 34 and a registration gate 35 are provided so as to align the leading edge of the developer sheet 38.

At downstream of the pressure developing unit 20, a pair of feed rollers 22 are provided so as to transport the sheet at a constant speed. This speed is coincident with a horizontally moving speed of the original support pane 2. At downstream of the feed rollers 22, a separation roller 23 is provided at which the microcapsule sheet 37 is separated from the developer sheet 38. The separated microcapsule sheet 37 is taken-up by the take-up shaft 25 through a meander travel control roller 24. On the other hand, a thermal fixing unit 30 is provided at the downstream of the separation roller 23. The thermal fixing unit 30 includes a hollow heat roller 29, in the interior of which a heater element 30A is disposed. Further, a pair of feed rollers 28 are provided to feed the image fixed developer sheet 38 toward a discharge tray 27.

Next, an optical system and optical path in the apparatus 40 will be described. As shown, the apparatus 40 has its top plate portion provided with a cover member 1 and the original support pane 2. The original support pane 2 is formed of a light transmissive material and is movable in the horizontal direction and on which an original (not shown) is placed with its image face down. At the upper right side of the apparatus 40, fixedly provided is a halogen lamp 3 extending in the direction perpendicular to the sheet of drawing, and a semi-cylindrically shaped reflector 4 disposed to surround the lamp 3. The halogen lamp 3 emits a light toward the original support pane 2.

Therefore, the light emitted from the halogen lamp 3 can be sequentially irradiated onto the entire surface over the region from the one to another ends of the original support pane 2 as the original support pane 2 moves horizontally. The light from the halogen lamp 3 passes through the transparent original support pane 2 and is reflected from the original placed thereon. The cover member 1 is provided to prevent this light from leaking out of the apparatus. To irradiate the light from the halogen lamp 3 onto the original at a high efficiency, a flat reflector 5 is disposed to face the halogen lamp 3, and receives the light from the lamp 3 and directs its toward the original. At the rear side of the halogen lamp 3, there are provided a fan 6 and a louver 7 for introducing an external air into the apparatus. Accordingly, air is effectively impinged upon the lamp 3 to cool the same.

A filter 8 is disposed below the original support pane 2. Further, a lens unit 9 is provided below the filter 8. Light emitted from the halogen lamp 3 and reflected from the original placed on the original support pane 2 passes through the filter 8 and enters the lens 9. The filter 8 alters the light transmissive characteristic in accordance with the sensitivity characteristics of the microcapsule sheet 37, to thereby adjust the color tone of a copied output image. The lens 9 is fixedly secured to a lens mounting plate 10, and fine angular adjustment of this lens with respect to a light path is achievable.

A pair of reflection mirrors 11 are provided below the lens 9. The focused light which has passed through the lens 9 changes its direction by 180 degrees (completely reverse direction) by the two reflection mirrors 11, and the thus oriented light is applied to the microcapsule sheet 37 closely contacting the bottom of an exposure table 19A to form the latent image thereon. The two reflection mirrors 11 are securely mounted to a mirror mounting plate 12. The mirror mounting plate 12 is vertically movably provided so that the adjustment of the distance of the light path and focusing adjustment can be effected by fine adjustment of the position of the mirror mounting plate 12. The original, the filter 8, the lens 9, the pair of reflection mirrors 11 and the exposure table 19A define a U-shape or J-shape light path in combination. That is, the optical path is bent into U-shape or J-shape, which path comprises a first vertical path directed downwardly, a second path directed horizontally and a third path directed upwardly. At the first optical path, the light reflected from the original is oriented downwardly, and at the third path the light is directed toward the imaging surface of the microcapsule sheet 37 at the exposure zone 19A, and the reflection mirror unit (11, 12) is disposed at the second optical path extending in horizontal direction. When the mirror mounting plate 12 is downwardly moved by a certain distance, the total light path distance is increased by a distance twice as long as the moving distance of the plate 12, yet maintaining the focusing position on the exposure zone 19A unchanged.

The mirror mounting plate 12 can maintain relative angular positional relationship between the pair of mirrors 11 regardless of the vertical movement of the plate 12. Accordingly, the plate 12 fixedly mounting the two mirrors can be simply assembled to the recording apparatus 40 as those can be treated as a single integral unit. It should be noted that only the pair of reflection mirrors 11 are required to obtain a normal upstanding or erect imaging direction at the exposure zone 19A, since the light is finally applied to the exposure zone upwardly, i.e., the microcapsule sheet 37 is exposed to light at the exposure zone 19A with the microcapsule coated surface facing down.

Operation of the apparatus 40 as arranged above will be described.

The microcapsule sheet 37 drawn out from the opening 13A of the cartridge 13 is fed by the feed rollers 15 and guided by the barrel roller 17. The sheet 37 then passes while contacting the lower face of the exposure table 19A where original image bearing light is applied to the sheet 15, so that a latent image is formed on the sheet 37.

More specifically, the cover member 1 is lifted up for mounting the original on the original support pane 2. Then, when a start button (not shown) is depressed, the original support pane 2 is moved to one direction (rightwardly in FIG. 1), so that one side edge of the pane 2 (left side edge in FIG. 1) stops at a first position where the one side edge of the pane 2 is coming into confrontation with the light source. Thereafter, with the halogen lamp 3 being lit, the original support pane 2 is then moved in a second direction (leftwardly in FIG. 1) opposite to the first direction. The light emitted from the halogen lamp 3 is reflected upon the original, and the light reflected thereupon passes through the filter 8 and lens 9 and is reflected at the two reflection mirrors 11. The last reflected light is finally directed toward the microcapsule sheet 37 which is located under the exposure table 19A, thereby forming a latent image on the sheet 37. At this time, since the microcapsule sheet 37 is moved under the exposure table 19A in the second direction (leftwardly in FIG. 1) at the same speed as the moving speed of the original support pane 2, the latent image corresponding to the original image is formed on the microcapsule sheet 37 at an equi-magnitude. Since the conveying speed of the microcapsule sheet 37 is controlled to be at constant by feed rollers 22 and is set equal to the moving speed of the original support pane 2, line latent images having given widths are sequentially formed on the microcapsule sheet 37 that is passing along the lower surface of the exposure table 19A.

The sheet 37 is then fed to the pressure developing unit 20 by the guide roller 17. At the pressure developing unit 20, the sheet 37 and the developer sheet 38 held in facial contact with each other are applied with pressure to develop the latent image and form a visible image on the developer sheet 38. The microcapsule sheet 37 leaving from the cartridge 13 is kept unexposed to light due to the presence of a shielding cover 16. The developer sheets 38 are fed out one by one by the sector roller 33, and each sheet 38 is fed to a sheet inlet of the pressure developing unit 20 after leading edge of the sheet 38 is aligned by developer sheet rollers 34 and the registration gate 35.

Accordingly, the microcapsule sheet 37 and the developer sheet 38 are fed to the pressure developing unit 20. The microcapsule coated surface of the sheet 37 on which a latent image is formed contacts the developer coated surface of the developer sheet 38 at a position inside the pressure developing unit 20, and these superposed sheets are pressed together by the small roller 21 and the backup roller 31. Unexposed microcapsules are ruptured by the pressure applied, to thereby form an output image on the developer sheet 38 because of the reaction of chromogenic material released from the ruptured microcapsules with the developer material.

In summary, in timed relation with the movement of the original support pane 2 in the second direction, the sector roller 33 feeds out the developer sheets 38 one by one from the developer sheet cassette 32. The developer sheet 37 is brought to facial contact with the exposed microcapsule sheet 37 and the both sheets are fed to the pressure developing unit 20 in which the latent image on the microcapsule sheet 37 is developed and transferred onto the developer sheet 38.

The microcapsule sheet 37 and developer sheet 38 leaving from the pressure developing unit 20 are fed out by the feed rollers 22 and are separated by the separation roller 23, the former sheet 37 directing upward and the latter sheet 38 directing in the straight direction. Thereafter, the developer sheet 38 is subjected to thermal fixing in the thermal fixing unit 30 and is then discharged onto the discharge tray 27 with its image surface up. The microcapsule sheet 37 leaving from the pressure developing unit 20 and passing through the separation roller 23 and the meandering control roller 24 is wound around the take-up shaft 25. When the movement of the original support pane 2 is stopped at a second position where another edge (right side in FIG. 1) of the pane 2 confronts the the light source, the scanning of the original image face is completed and the halogen lamp 3 is turned off.

Figure 2:
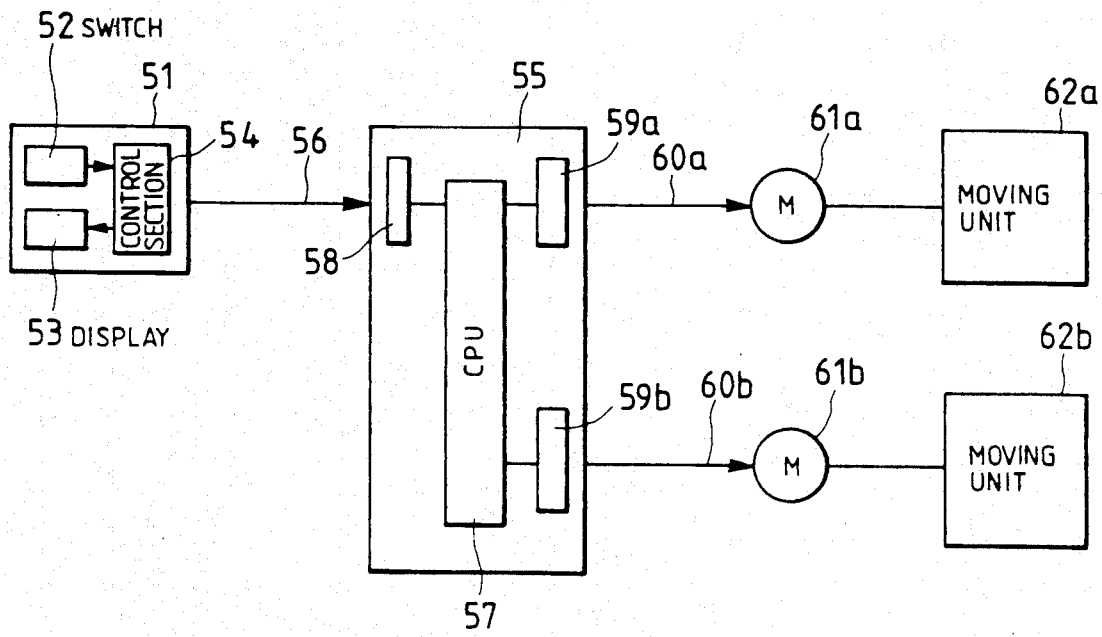
FIG. 2 is a block diagram showing an electrical unit incorporated in the apparatus shown in FIG. 2.
Figure 3:
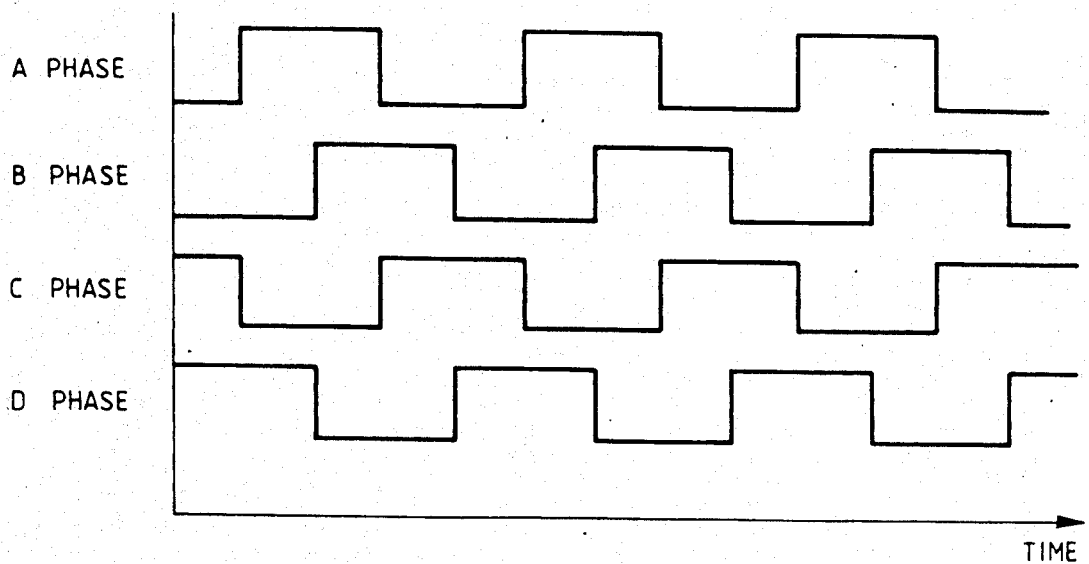
FIG. 3 is a diagram showing waveforms of driving signals applied to stepper motors.

Referring to FIGS. 2 and 3, description will be made with respect to an electrical unit incorporated in the recording apparatus shown in FIG. 1 used for controlling an image density. The electronic unit includes a panel unit 51 and a scanning speed control unit 55. The panel unit 51 includes a switch section 52, a display section 53 and a panel control section 54. The switch section 52 which serves as a density setting means is provided for inputting a desired image density by the user's manipulation. The display section 53 includes a plurality of LEDs (light emitting diodes) for displaying the image density as set in the switch section 52. The panel control section 54 reads the image density as set and controls the lightings of the LEDs in the display section 53 in accordance therewith. The panel control section 54 further transmits an image density instruction signal 56 to the scanning speed control unit 55.

The scanning speed control unit 55 includes a microcomputer (hereinafter referred to as "CPU") 57 serving as a whole as first and second drive signal generating means and a control means. The CPU 57 receives the density instruction signal 56 from the panel unit 51 via an input port 58 and implements operations in response thereto to determine the rotational speeds of first and second stepper motors 61a and 61b. The CPU 57 outputs a first drive signal 60a for driving the first stepper motor 61a through an output port 59a. The first stepper motor 61a moves the original support panel 2 through an original support pane moving unit 62a. The CPU 57 further outputs a second drive signal 60b for driving the second stepper motor 61b through an output port 59b. The second stepper motor 61b moves a microcapsule transportation means which includes the rollers 22 and the take-up shaft 25 through a sheet transportation moving unit 62b. The first and second stepper motors 61a and 61b serve as first and second drive means and are rotated in accordance with the first and second drive signals, respectively. The rotations of the first motor 61a is transmitted through the original support pane moving unit 62a to the original support pane 2, while the rotations of the second motor 61b is transmitted through the sheet transportion moving unit 62b to the feed rollers for transporting the microcapsule sheet 37. Each of the moving units 62a and 62b is comprised of gears, belts, or the like. It should be noted that the first and second driving signals are correlated to each other, so that the sheet transportation moving unit 62b is actuated in timed relation to the movement of the original support pane 2.

The driving pulses 60a and 60b as shown in FIG. 3 are applied to the stepper motors 60a and 60b. The rotational speeds of the stepper motors 60a and 60b are controlled by controlling the frequencies of the driving pulses in accordance with the image density set through the switch section 52. For example, for photosoftenable microcapsule sheets, if the user changes the image density from "light" to "dark", with the use of the photocuring type microcapsule sheet the scanning speed is changed from "fast" to "slow" and vice versa for photohardenable microcapsule sheets. To this effect, the frequency of the driving pulse applied to each phase of the stepper motor is changed to a high value.

Although description has been made with respect to the stepper motors, other types of motors may be employed, such as a D.C. motor. Further, a single motor would suffice to achieve the goal if the rotations of the single motor is transmitted to both the moving units 62a and 62b.

In the embodiment as described, it has been described that the panel unit 51 is provided with the panel control unit 54, in which the the amount of image density as set is converted to an electrical signal, i.e. the image density instruction signal 56 and the latter is transmitted to the scanning speed control means 55. However, in accordance with the present invention, it not necessarily requisite that the image density as instructed be converted to the electrical signal. It is only essential that either directly or indirectly, the scanning speed control means 55 needs to be informed of the image density inputted from the switch section 52.

As described, according to the present invention, the adjustment of the image density is achieved by the change of the scanning speed, not the change of the exposure amount of the light source. Therefore, the amount of light from the light source needs not be changed but can be maintained at constant, whereby the load imposed to the light source is decreased and thus the service life of the light source can be prolonged. In addition, a large amount of heat which may otherwise be generated if the amount of exposure is increased is not generated, thus no special heat treatment is necessary. The present invention is particularly advantageous when recording mediums low in photo-sensitivity, such as the photosensitive pressure-sensitive recording medium, are used.

Although the present invention has been described with respect to a specific embodiment, it will be appreciated by one skilled in the art that a variety of changes and modifications may be made without departing from the scope of the invention. For example, certain features may be used independently of others and equivalents may be substituted all within the spirit and scope of the invention. For example, although it has been described that the image face of the original is being scanned in accordance with the movement of the original support pane 2 while fixedly disposing the light source 3, the light source 3 may be moved while fixedly providing the original support pane, or both the original support pane 2 and the light source 3 may be moved relative to each other.

What is claimed is:

1. An image recording apparatus for recording an image of an original on a photosensitive recording medium, a density of said image recorded on said recording medium being changed depending upon an amount of light applied to said recording medium, said apparatus comprising:
    an original support member for supporting said original;
    a light source for emitting a light toward said original supported on said original support member;
    a first drive signal generating means for generating a first drive signal;
    a first driving means responsive to said first drive signal for driving at least one of said original support member and said light source to move relative to each other at a first speed corresponding to said first drive signal, said image of said original being scanned at said first speed by said light emitted from said light source, an image bearing light bearing said image of said original being provided as a result of the scanning;
    a second drive signal generating means for generating a second drive signal;
    a second driving means responsive to said second drive signal for moving said recording medium at a second speed corresponding to said second drive signal, said second drive speed being in coincidence with the first drive speed;
    an optical means for receiving and applying said image bearing light onto said recording medium to record said image of said original thereon;
    a density means for setting a density of said image to be reproduced on said recording medium and providing an image density instruction signal;
    a control means for controlling said first drive signal generating means in accordance with said image density instruction signal, whereby said density of said image to be recorded on said recording medium is controlled by the change of the scanning speed.

2. An image recording apparatus according to claim 1, further comprising a display means for displaying said density set by said density setting means.

3. An image recording apparatus according to claim 1, wherein said light source is fixedly provided and said original support member is movable relative to said light source.

4. An image recording apparatus according to claim 1, wherein said original support member is fixedly provided and said light source is movable relative to said original support member.

5. An image recording apparatus according to claim 1, wherein said photosensitive recording medium has a surface coated with a plurality of microcapsules separately encapsulating a photo-curing resin and a chromogenic material of one of three primary colors selected from cyan, magenta and yellow, said photo-curing resin being photo-cured when exposed to light.

6. An image recording apparatus according to claim 1, wherein said photosensitive recording medium has a surface coated with a plurality of microcapsules separately encapsulating a photo-softening resin and a chromogenic material of one of three primary colors selected from cyan, magenta and yellow, said photo-softening resin being photo-softened when exposed to light.

7. An image recording apparatus according to claim 5, wherein when the density of said image to be reproduced is changed darker by said density setting means, the scanning speed is increased.

8. An image recording apparatus according to claim 6, wherein when the density of said image to be reproduced is changed darker by said density setting means, the scanning speed is decreased.

9. An image recording apparatus for recording an image of an original on a photosensitive recording medium, a density of said image recorded on said recording medium being changed depending upon an amount of light applied to said recording medium, said apparatus comprising:
   an original support member for supporting said original;
   a light source for emitting a light toward said original supported on said original support member;
   a first drive signal generating means for generating a first drive signal;
   a first driving means responsive to said first drive signal for driving at least one of said original support member and said light source to move relative to each other at a first speed corresponding to said first drive signal, said image of said original being scanned at said first speed by said light emitted from said light source, an image bearing light bearing said image of said original being provided as a result of the scanning;
   an optical means for receiving and applying said image bearing light onto said recording medium to record said image of said original thereon;
   a density setting means for setting a density of said image to be reproduced on said recording medium and providing an image density instruction signal;
   a control means for controlling said first drive signal generating means in accordance with said image density instruction signal so that said density of said image to be recorded on said recording medium is changed depending upon the change of scanning speed.

10. An image recording apparatus according to claim 9, further comprising a second drive signal generating means for generating a second drive signal and a second driving means responsive to said second drive signal for moving said recording medium at a second speed corresponding to said second drive signal, and wherein said control means further controls said second drive signal generating means in accordance with said image density instruction signal.

11. An image recording apparatus according to claim 10, wherein said first and second speeds are in coincidence with each other.

12. An image recording apparatus according to claim 10, further comprising a display means for displaying said density set by said density setting means.

13. An image recording apparatus according to claim 9, wherein said light source is fixedly provided and said original support member is movable relative to said light source.

14. An image recording apparatus according to claim 9, wherein said original support member is fixedly provided and said light source is movable relative to said original support member.

15. An image recording apparatus according to claim 1, wherein said photosensitive recording medium has a surface coated with a plurality of microcapsules separately encapsulating a photo-curing resin and a chromogenic material of one of three primary colors selected from cyan, magenta and yellow, said photo-curing resin being photo-cured when exposed to light.

16. An image recording apparatus according to claim 1, wherein said photosensitive recording medium has a surface coated with a plurality of microcapsules separately encapsulating a photo-softening resin and a chromogenic material of one of three primary colors selected from cyan, magenta and yellow, said photo-softening resin being photo-softened when exposed to light.

17. An image recording apparatus according to claim 15, wherein when the density of said image to be reproduced is changed darker by said density setting means, the scanning speed is increased.

18. An image recording apparatus according to claim 16, wherein when the density of said image to be reproduced is changed darker by said density setting means, the scanning speed is decreased.

* * * * *